United States Patent [19]

Kazmirski

[11] Patent Number: 5,117,167
[45] Date of Patent: May 26, 1992

[54] COMMUTATING ENERGY SUPPRESSION CIRCUIT FOR AN ELECTRONICALLY COMMUTATED DC MOTOR

[75] Inventor: Todd Kazmirski, W. Hurley, N.Y.

[73] Assignee: Rotron, Incorporated, Woodstock, N.Y.

[21] Appl. No.: 607,518

[22] Filed: Nov. 1, 1990

[51] Int. Cl.⁵ .................................................. H02P 6/02
[52] U.S. Cl. ...................................... 318/439; 318/138; 318/254; 361/91; 363/56
[58] Field of Search ...................... 363/50, 56; 361/91, 361/86, 58, 30-31, 33; 388/825-835; 318/138, 254, 439

[56] References Cited

U.S. PATENT DOCUMENTS

| | | | |
|---|---|---|---|
| 3,629,675 | 11/1970 | Porath | 318/138 |
| 3,679,953 | 7/1972 | Bedford | 318/138 |
| 3,959,700 | 5/1976 | Sugiura et al. | 318/138 |
| 4,005,347 | 1/1977 | Erdman | |
| 4,065,708 | 12/1977 | Ulland et al. | 318/685 |
| 4,169,990 | 10/1979 | Erdman | |
| 4,336,562 | 6/1982 | Kotowski | 361/88 |
| 4,387,328 | 6/1983 | Presley | |
| 4,387,330 | 6/1983 | Zigler | 318/788 |
| 4,463,291 | 7/1984 | Usry | |
| 4,594,535 | 6/1986 | Morikawa | |
| 4,633,358 | 12/1986 | Nagano | 361/31 |
| 4,687,977 | 8/1987 | Brahmavar et al. | |

Primary Examiner—William M. Shoop, Jr.
Assistant Examiner—David Martin
Attorney, Agent, or Firm—Brumbaugh, Graves, Donohue & Raymond

[57] ABSTRACT

A voltage surge sensing and control circuit is coupled to the dc power supply inputs of the electronic commutator. This circuit acts to sense the input voltage which is to be applied across the ECDC motor windings. When the input voltage is determined to be high enough to generate commutation energy sufficient to damage a power transistor, if applied to it singularly, the voltage surge control circuit acts to distribute the excess energy over a number of power transistors in the commutation circuit, thereby, protecting the power transistors from excess voltage applied through the system by distributing the excess energy over a number of conducting power transistors simultaneously. The present invention also minimizes commutation energy across the transistors by using bonded bifilar wiring and phase decoupling capacitors. The bonded bifilar wiring acts to minimize the inductance field, whereas the phase decoupling capacitors act to absorb energy generated after the winding phases are deenergized.

14 Claims, 5 Drawing Sheets

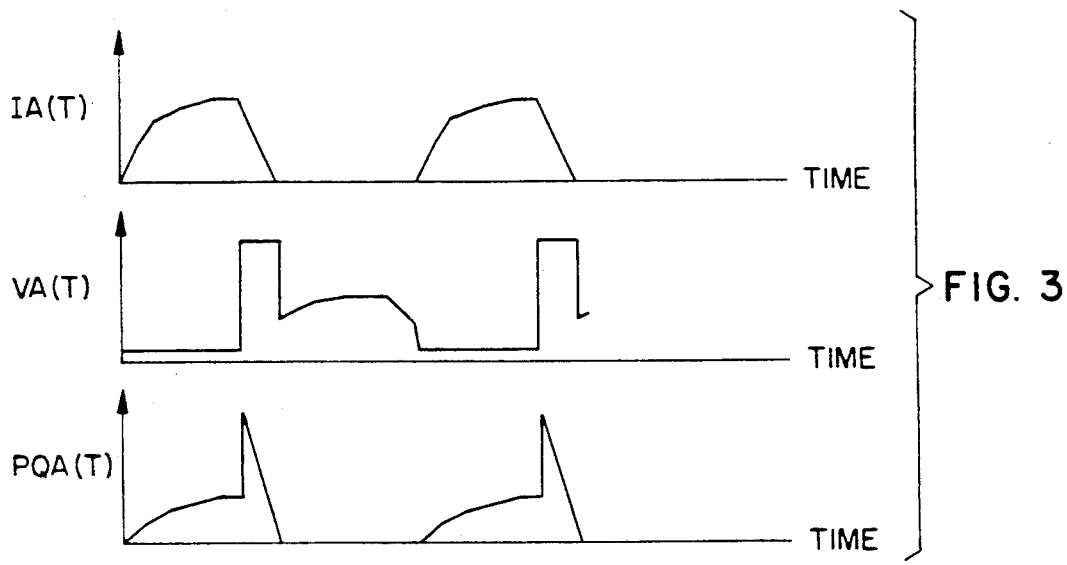
FIG. 3
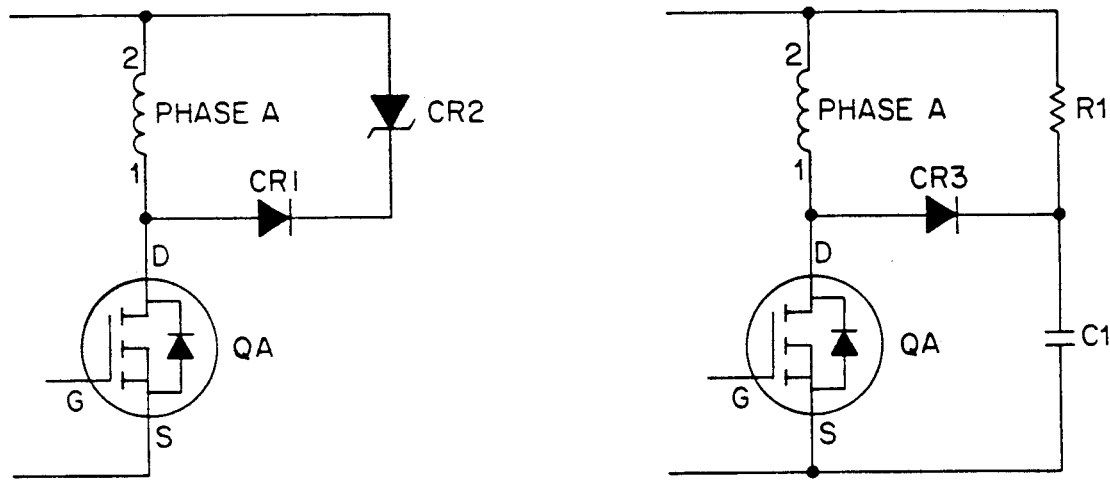
FIG. 4a
FIG. 4b
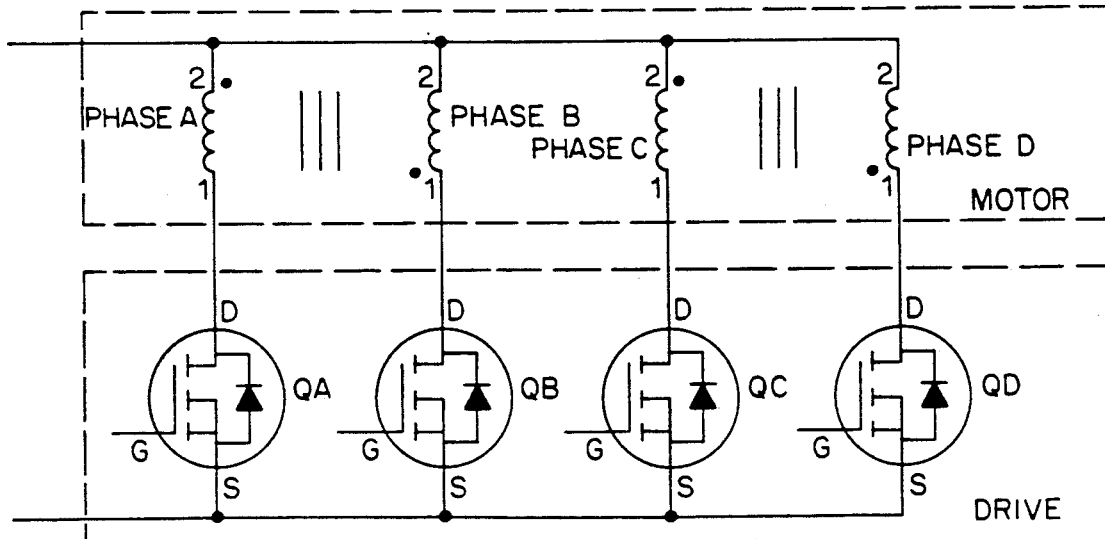
FIG. 5

COMMUTATING ENERGY SUPPRESSION CIRCUIT FOR AN ELECTRONICALLY COMMUTATED DC MOTOR

BACKGROUND OF THE PRESENT INVENTION

This invention relates to electronically commutated DC motors [ECDC motors], and more particularly, to low cost ECDC motors having inherent commutating energy suppression with over-voltage protection.

Although ECDC motors have longer life, higher operating speeds, lower maintenance requirements and lower electromagnetic interference than the industry standard DC brush motor, the ECDC motors have remained relatively more expensive then the DC brush motor. In order to make the ECDC motor more competitive with its industry rival it has become necessary to reduce its cost while maintaining its advantageous qualities.

The use of power transistors at or near their rated capacity could reduce cost by permitting the choice of lower cost power transistors, but this leaves little margin for error in the event of a voltage surge exceeding the voltage rating of the transistor. The use of higher voltage rated transistors has two disadvantages. First, it increases the cost of the transistors. Second, in the case of field effect transistors (FET's), which are often used in ECDC drives, the on resistance of the transistors increases with higher voltage rated transistors. This represents two increased costs in the system. One being the additional cost of making the motor and second, the additional power consumption used in its operation. Thus, it is very desirable to reduce the voltage rating of the power transistors used in the ECDC motor commutator circuit while taking into account such factors as temporary voltage surges in the dc power supply to the commutator circuit and commutation energy.

Another area of the ECDC motor in which cost reduction may be pursued is in the ECDC electronic drive configuration (electronic commutator configuration). A common electronic commutator is a full wave three phase drive as shown in FIG. 1. In order to reduce costs, the number of power components in the electronic commutator were reduced by converting to a half wave configuration. One such design is shown in FIG. 2. The half wave design reduced the number of power transistors needed in the electronic commutator, eliminated the need for high side drivers to control the upper power transistors, reduced the cost, and had a higher electronic drive current capability for an equivalent transistor conduction power loss. However, the half wave motor design can only operate at approximately 70% of the maximum continuous operating torque of a full wave commutator driven motor when using an equivalent rotor magnet and stator lamination design.

A second disadvantage of the half wave configuration is caused by energy stored in the magnetic field created by the stator winding when conducting current. This energy, herein referred to as the commutating energy, is imposed on the transistor when it is switched from an on to an off state. Commutation energy is typically not a problem in low power applications. However, in higher power applications, the greater commutating energy results in a high energy inductive voltage spike being imposed across the transistor. As shown in FIG. 3, this inductive spike causes the transistor to avalanche. The avalanche dissipates the commutating energy in the transistor, and at high power levels, excessive heat is created in the transistor and destroys the transistor. The result is a catastrophic failure of the commutation circuit. To suppress this avalanche, various suppression networks can be incorporated in the drive.

Two examples of suppression networks are shown in FIG. 4. These suppression networks have two undesirable traits. First, they increase cost. Second, they do not produce greater mechanical power from the motor. Thus higher power half wave drives must add an expensive snubber network which does not produce any additional mechanical power. A half wave drive design will only remain low cost if it inherently can suppress the commutating energy so that it does not cause catastrophic failure of the commutation circuit. In other words, the snubbing must be low cost or not required at all.

SUMMARY OF THE INVENTION

According to the present invention, a voltage surge sensing and control circuit is coupled to the dc power supply inputs of the electronic commutator. This circuit acts to sense the input voltage which is to be applied across the ECDC motor windings. When an input surge voltage is determined to be high enough to impose a voltage approaching the voltage rating of any power transistor which is off at the time of the surge, the voltage surge control acts to turn all the transistors on. The voltage across the transistor thus becomes the on voltage or conduction voltage of the transistor, thereby protecting the power transistors from an excess voltage which would result in catastrophic avalanche of the transistor. The voltage surge is thus imposed across the winding and isolated from the power transistors. The energy in the surge is primarily dissipated in the stator winding of the motor.

The present invention also seeks, as a second feature, to minimize commutation energy imposed on the transistors by using inherent commutation energy suppression. This is accomplished by using a bifilar wound stator, bonded bifilar wire, and phase decoupling capacitors. The bonded bifilar wiring acts to minimize the field inductance field, whereas the phase decoupling capacitors act to absorb energy generated after the winding phases are deenergized.

The ECDC motor includes a stator with a plurality of windings, a permanently magnetized rotor cooperating with the stator, a plurality of switching transistors, each of which is connected to conduct current to one of the windings in response to a control signal, a switching control means responsive to the position of the rotor for outputting said control signals, the dc power input means for supplying power potential necessary to conduct current across the windings, and the over-voltage sensing and control circuit, including means responsive to over-voltage from the dc power input means for providing an output effective to cause conduction of each of the plurality of switching transistors simultaneously. This simultaneous conduction of the switching transistors shields the transistors from the input voltage surge condition.

In accordance to a second feature of the invention, windings that are 180 electrical degrees out of phase are bifilar windings and thus closely coupled so that the voltage spike resulting from the collapse of the field when a winding's power transistor is turned off is shared with the commutation circuit of the winding 180 electrical degrees out of phase. This reduces the need for a power transistor capable of withstanding the total dissipation of the energy stored in the associated winding. However, leakage flux can represent a considerable amount of energy not shared by the bifilar windings and not subject to the foregoing benefit. The leakage field generated by the winding when it is energized is reduced with the use of bonded bifilar wire winding for the two stator out of phase windings. Each wire in the bifilar pair is closely bonded to the other to greatly reduce the leakage field. This reduces the leakage field energy that otherwise would have to be dissipated in only the circuit of that one winding producing the leakage field.

In accordance to a third feature of the present invention, leakage field energy absorbing protection for a switching transistor in a drive circuit for an ECDC motor is used to further reduce commutation energy imposed on the power transistor. A phase decoupling capacitance connects the two bifilar windings 180 electrical degrees out of phase. The phase decoupling capacitance acts to absorb energy stored in the leakage inductance field of the winding phase after the winding phase has been deenergized.

BRIEF DESCRIPTION OF THE DRAWINGS

For a more complete understanding of the present invention, reference is made to the following Detailed Description taken in conjunction with the accompanying drawings in which:

FIG. 3 is a waveform diagram for a transistor in FIG. 2 having an inductive voltage spike imposed across it;

FIGS. 4(a) and (b) are schematic diagrams of a pair of commuting energy voltage spike suppression networks used in a half wave drive to help protect the switching transistors;

FIG. 5 is a schematic diagram of a four phase half wave ECDC system in which the embodiments of the present invention may be utilized;

DETAILED DESCRIPTION

Figure 8A:
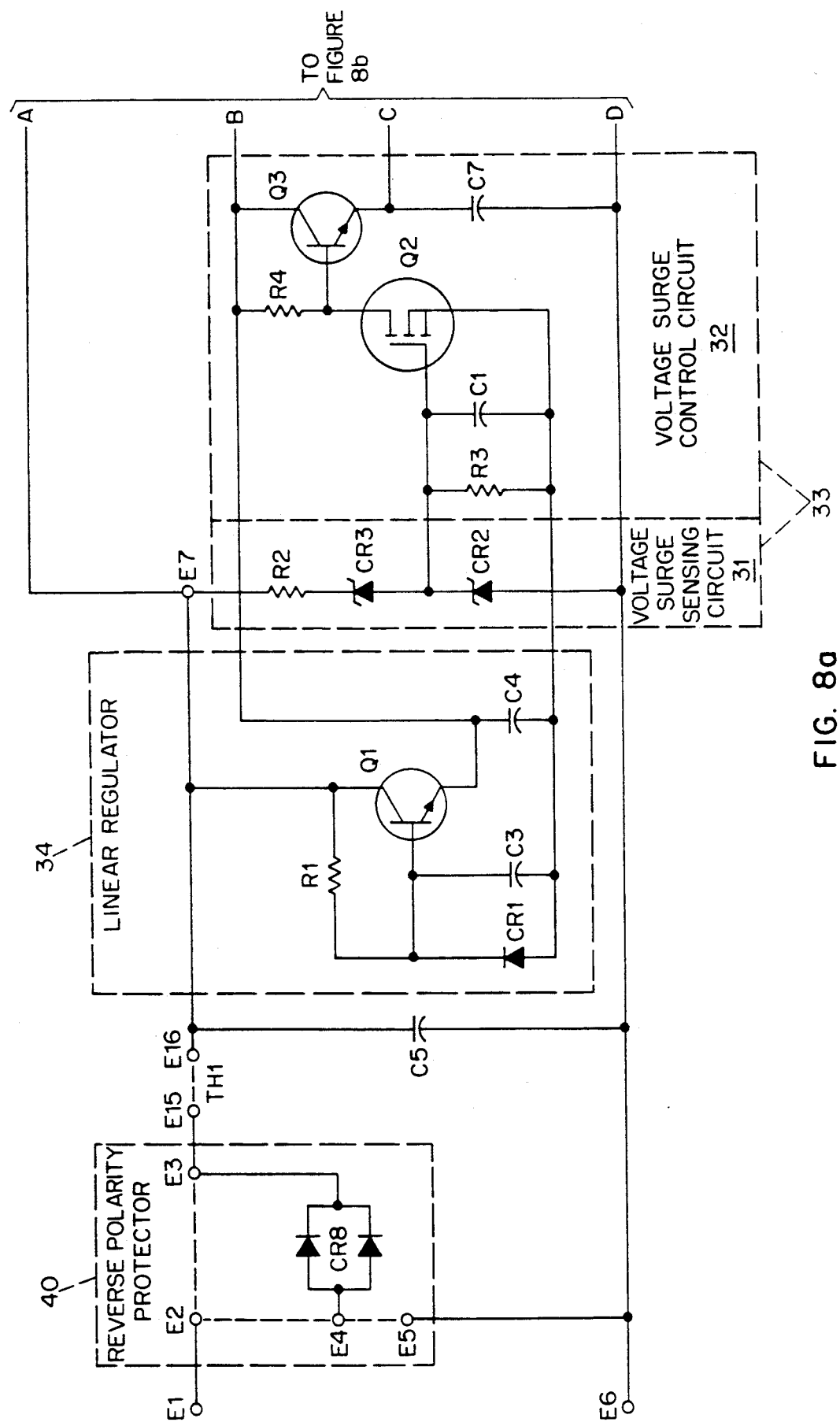
FIGS. 8(a) and (b) make up a schematic diagram of a ECDC motor having embodiments according to the present invention.
Figure 8B:
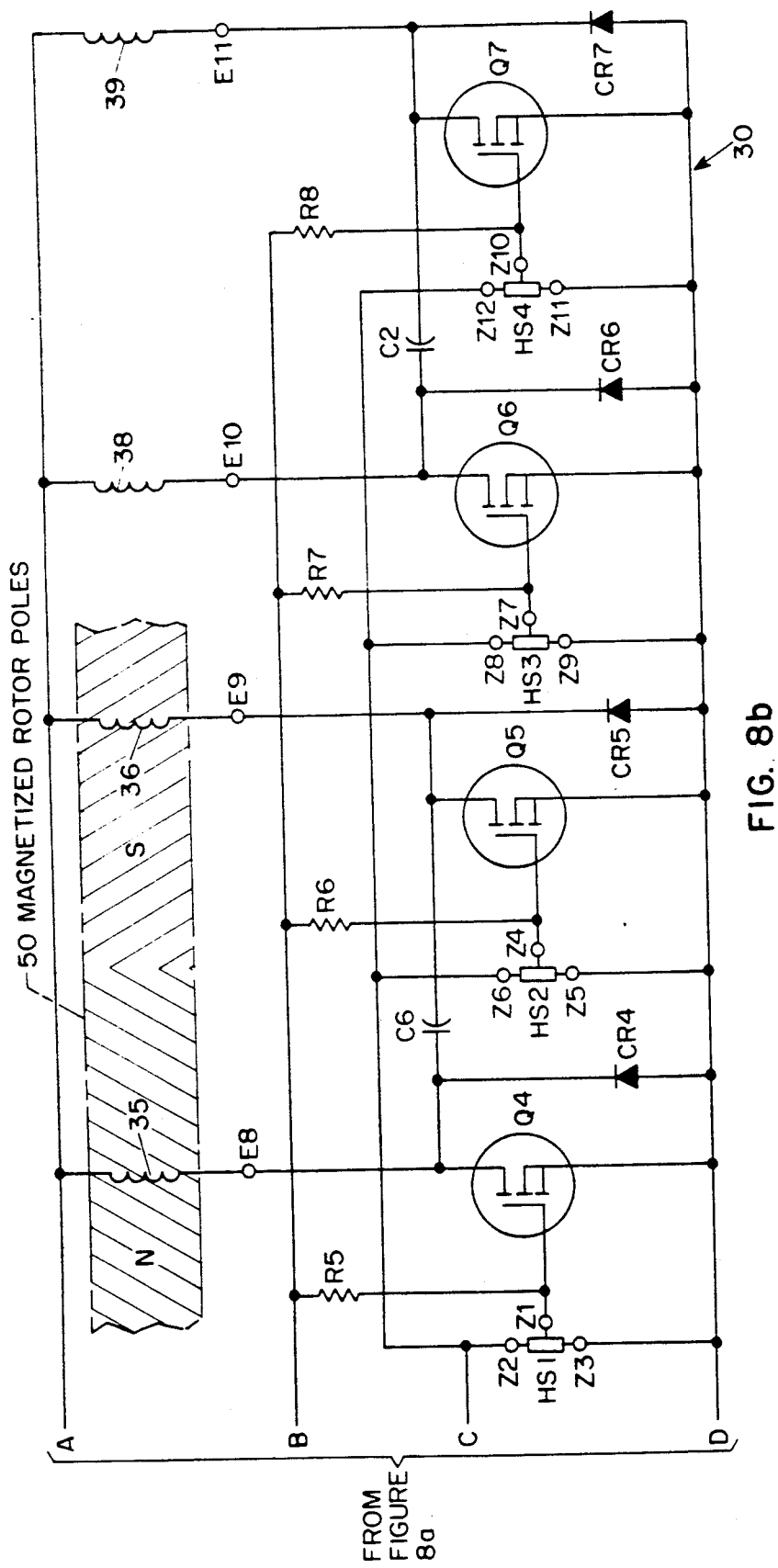

FIG. 8 is a schematic diagram of an exemplary ECDC motor embodying the present invention. In FIG. 8, a four phase half wave drive 30 incorporates a voltage surge and sensing circuit 33, two pairs of bifilar winding phases, 35 and 36, and 38 and 39, and phase decoupling capacitors C2 and C6, explained in greater detail below. These electronic commutator circuit components effectively reduce the maximum commutating energy imposed across the phase switching transistors and eliminate the need for expensive surge suppression networks and higher voltage rated power transistors.

In FIG. 8, a pair of dc power inputs are connected to input terminals E1 and E8, wherein terminal E1 is the positive power terminal and terminal E6 is the ground terminal. To protect against reverse polarity connection of the dc power terminals, a reverse polarity protection diode pair, CR8, may be connected to the input terminals. A series of open jumper connections E2, E3, E4, and E5 are available to either adjust the manner in which the reverse polarity diodes operate, or to bypass them entirely.

The reverse polarity protection diodes may be bypassed by connecting jumper terminal E2 to terminal E3 and leaving terminals E4 and E5 unconnected. One protection scheme is attained by connecting terminals E2 and E4. This provides a reverse voltage protection to the electronic commutator and is referred to as series reverse polarity protection. A second alternative is to use a crowbar diode protection scheme. This is achieved by connecting terminals E2 and E3 and terminals E4 and E5. This connection produces a virtual short between the two dc power inputs if they are connected in reverse. This is effectively used with an external fuse (not shown) which blows when an over-current condition is generated. The choice of connection does not affect the function of the rest of the circuit, but depends on the needs of the user.

Similarly, a thermal sensor TH1 is connected between terminals E15 and E16. This sensor stops input of dc voltage to the electronic commutator when the internal circuit is overheating by generating an open circuit between its terminal connections E15 and E16. Thermal sensor TH1 would cause dc power to be reapplied to the circuit once the circuit temperature had fallen below a pre-establish point.

A noise capacitor C5 is connected subsequent to terminal E16. It connects the two power terminals E1 and E6, and serves to protect the electronic commutator from inrushes of current caused when switching transistors Q4, Q5, Q6, and Q7 are turned on to energize their respective bifilar phases. Capacitance C5 stabilizes the voltage applied across the electronic commutator circuitry 30 and prevents the voltage surge sensing and control circuit 33, described below, from ending normal operation of the ECDC motor every time a short voltage spike is generated by the dc power source.

Two bifilar winding pairs in the stator, 35 and 36, and 38 and 39, are used to make up the four phases of the circuit. Bifilar phase 35, 36, 38 and 39 each have one lead connected to terminal E7, the positive dc power terminal. Each phase of the bifilar pair also has a lead connected to a switching transistor, Q4, Q5, Q6 and Q7. When the switching transistors are turned on, current conducts through their respective winding, thereby generating a magnetic field acting to rotate a rotor, the permanent magnetic poles of which are indicated generally at 50.

In the electronic commutator shown in FIG. 8, each switching transistor has one Hall Switch to control its operation. Hall switches HS1, HS2, HS3, and HS4 have three terminals each. The Hall switches turn on their respective transistors Q4, Q5, Q6, and Q7, by applying a positive voltage to the gate of the transistor, and turn it off by connecting the gate to ground. The operation of Hall switches is well known in the art, but a brief description of the operation of Hall switch HS1 will now be provided. Hall switch HS1 has a first terminal Z1 coupled to the gate of switching transistor Q4. Also applied on that gate is a dc voltage supplied by a linear regulator, discussed hereinafter. The second terminal of HS1, Z2, is connected to positive dc power supply as controlled by voltage surge sensing and control circuit 33, also discussed hereinafter. The third terminal Z3, is a ground terminal. Hall switch HS1 operates to detect the position of the permanently magnetized rotor. The switch causes terminal Z1 to either be effectively grounded by connecting Z1 to Z3 in the presence of a magnetic field of appropriate polarity, or to effectively isolate Z1 from Z3 in the absence of the magnetic field and thus to have dc power applied on it via a resistor R5. The motor rotor is typically provided with one or more permanent commutation magnets (not shown), supported for rotation with the field magnets whose poles 50 are indicated in FIG. 8. The poles of the commutation magnets are located to effect switching of the Hall switches at the appropriate time, as is well documented in the art. Thus, if the rotor is in a position in which the particular bifilar phase should be energized, dc power is applied across Z1 so that the switching transistor is turned on. Otherwise, if the rotor is positioned such that the bifilar phase need not be energized, terminal Z1 is grounded via terminal Z3, and no current is caused to conduct through transistor Q4. However, if dc power to terminal Z2 is disconnected, Hall switch HS1 is inoperative and causes terminals Z1, Z2 and Z3 to act as if they were disconnected open circuits. Thus, the constant voltage applied to the gate of switching transistor Q4 by linear regulator 34, via resistor R5 would cause transistor Q4 to be turned on. Hall switches HS1, HS2, HS3 and HS4 work in the same manner and each operates to energize its transistor at different sequential periods necessary to rotate the rotor relative to the stator. An example of such sequential energizing techniques is provided in the discussion relating to FIG. 5, later discussed in detail.

Linear voltage regulator 34 supplies a constant voltage to the gates of switching transistors Q4, Q5, Q6 and Q7 and to the rest of the control circuitry in electronic commutator 30. The voltage regulator 34 comprises a transistor Q1, a resistor R1, a diode CR1, and capacitors C3 and C4. This circuit keeps voltage variations from the commutator control circuitry.

A voltage surge sensing and control circuit 33 acts to sense dc power supply surges imposed across bifilar phases 35, 36, 38, 39, and effectively shields all of the transistors from the surge by imposing the surge across the bifilar windings and not across the transistors. This allows the necessary voltage rating of transistors Q4, Q5, Q6, and Q7 to be safely reduced, thereby reducing the inherent on resistance of the transistors and the production and operation costs of the electronic drive.

Voltage surge sensing and control circuit 33 functions as follows. Zener diode CR3 is connected in series with a Zener diode CR2 and via a resistor R2 to terminal E7. Together they make up a voltage surge sensor 31. Until a voltage surge greater then the breakdown voltage of the Zener diode is applied, no current is allowed to flow to a resistor R3 and capacitor C1, thereby keeping transistor Q2 off and transistor Q3 on. As a result, positive voltage is applied to terminals Z2, Z6, Z8 and Z12 of Hall switches HS1, HS2, HS3, and HS4, and the ECDC motor operates in its normal manner. However, when a voltage greater than the breakdown voltage of the Zener diode CR3 is applied across it, current is allowed to flow through to the resistor R3 and capacitor C1, raising the voltage on the gate of transistor Q2, thereby turning on the transistor Q2 and shutting off the transistor Q3 by effectively grounding its base. As explained above, this causes dc power to the Hall switches to be turned off, thereby turning on transistors Q4, Q5, Q6 and Q7. Thus, voltage surges are imposed across the windings and the voltage across the transistors is limited to the conduction voltage of the device when the dc input voltage exceeds the reverse breakdown voltage of Zener diode CR3.

To protect the transistors Q4, Q5, Q6 and Q7, from excessive commutation energy, bifilar wiring is used in addition to decoupling capacitance C2 and C6. The bifilar winding phases 35, 36, 38, and 39, are a product of bifilar windings discussed above. Thus, phase 35 is 180 electrical degrees out of phase with phase 36, and phase 38 is 180 electrical degrees out of phase with phase 39. Decoupling capacitor C6 is connected between phases 35 and 36, and decoupling capacitor C2 is connected between phases 38 and 39. There ar thus provided the advantages discussed below relating to inherent energy suppression of the bifilar wiring and energy absorbing by the decoupling capacitance connected phase to phase.

Diodes CR4, CR5, CR6 and CR7 are transient voltage suppression diodes. They are designed to avalanche or turn on before the voltage capability of transistors Q4, Q5, Q6 and Q7 are exceeded. These are included into the design to provide added design margin. They are not necessary under normal operation.

In FIG. 5, for the purpose of describing the effect of bifilar winding of the phases 180$^e$ apart, a generalized half bridge drive design is shown. This design may be used in any ECDC motor with any even number of phases. In FIG. 5, phase A is 180 electrical degrees out of phase with phase B. Phase C is 180 electrical degrees out of phase with phase D. This relationship is easily obtained by winding a bifilar winding and then reversing the connection on each of the bifilar winding wires as indicated. During normal operation each phase will conduct for 120 to 180 electrical degrees depending upon the design. The conduction time for phase A leads that of phase B by 180 electrical degrees. This same relationship also holds for phases C and D; phase A conduction leads phase C by 90 electrical degrees. Thus if the conduction angle is 120 degrees the following conduction pattern holds. QA is switched on from 0 to 120 degrees. QB would be on from 180 to 300 degrees. QC conducts from 90 to 210 degrees and QD is activated from 270 to 390 degrees.

Figure 1:
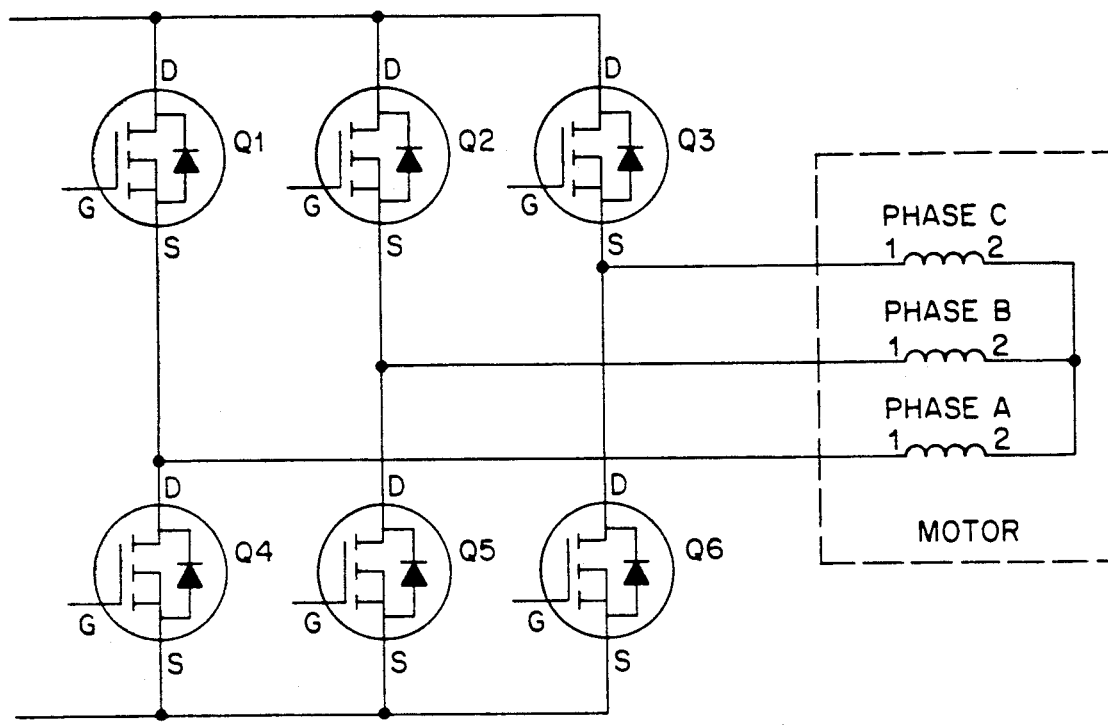
FIG. 1 is a schematic diagram showing a three phase full wave drive used to drive an ECDC motor used in the prior art.
Figure 2:
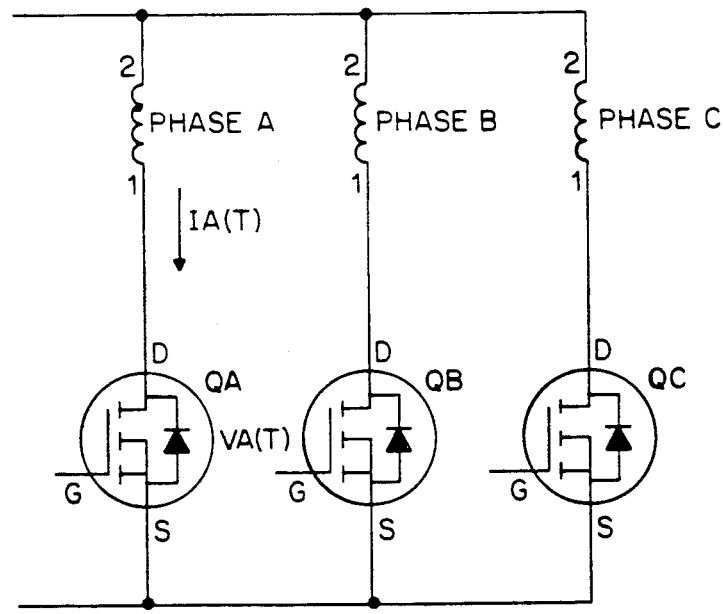
FIG. 2 is a schematic diagram of a simple three phase half wave drive.
Figure 6:
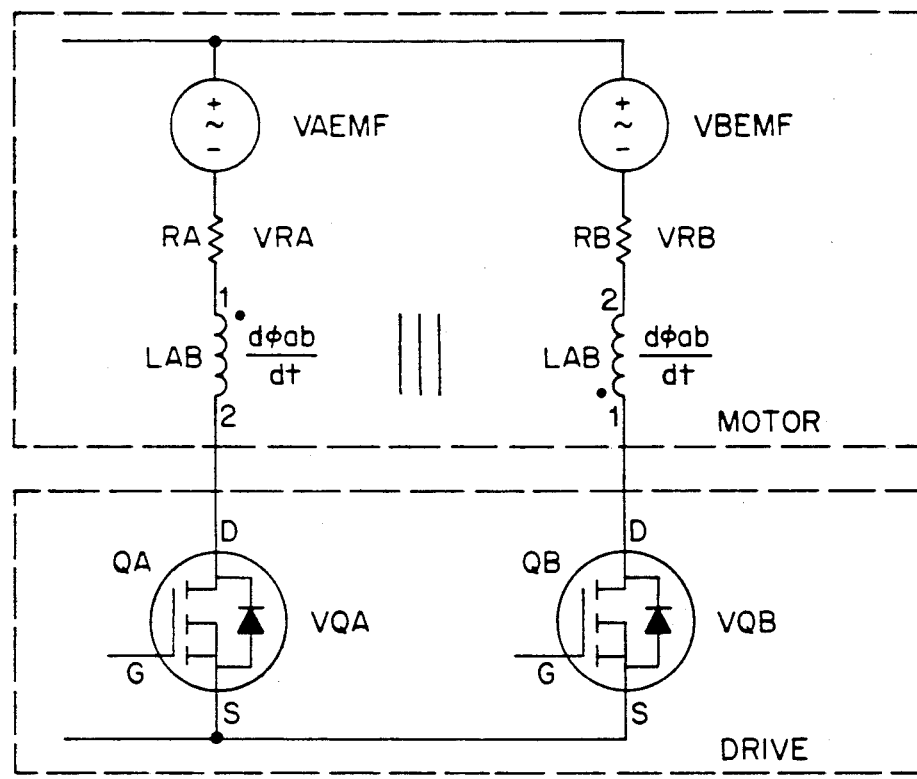
FIG. 6 is a schematic representation of an ideal two phase half wave circuit.

An ideal equivalent circuit model representation of the drive of FIG. 5 is shown in FIG. 6 for phases A and B. In this circuit, VAEMF and VBEMF are the back emf voltages generated by the rotor. RA and RB are the resistances of the two phases. LAB is the mutual inductance between the two phases. Since the coils for phases A and B are wound and inserted in parallel, it is assumed that flux generated by phase A is completely coupled to phase B.

Inherent suppression occurs in the following manner. When QA turns off after conducting current, the collapse of the magnetic field generated by the previous current in phase A creates a voltage $d\Phi/dt$ across phase A. This voltage is reversed and mirrored in phase B due to the mutual inductance between phases A and B. The voltage in phase B will forward bias the diode in QB when it exceeds the combined voltage of VBEMF, VIN, (IB)×(RB), and the forward voltage drop of the diode. Thus, the voltage $d\Phi/dt$ in both phases is clamped by the action of phase B and its drive circuitry.

Figure 7:
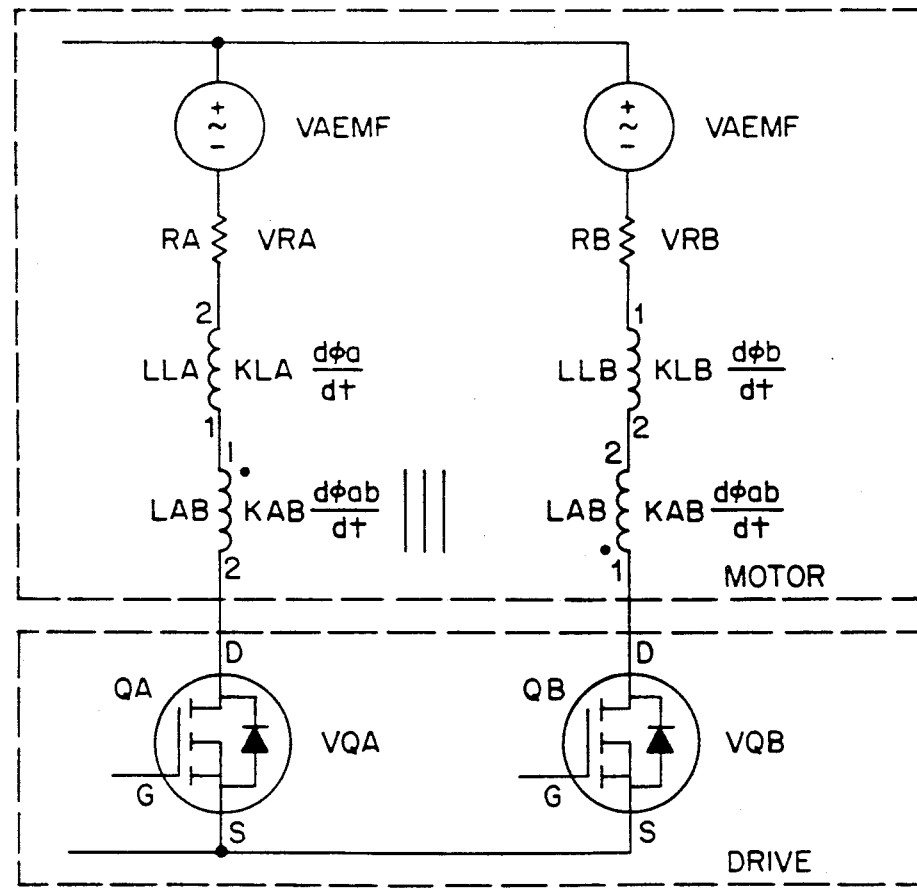
FIG. 7 is a schematic representation of a practical model for a two phase half wave ECDC motor drive.

The voltage rating of the transistors QA and QB can be chosen so that this rating will not be exceeded. By designing in this manner the transistor will not be forced into an avalanche mode before the diode in QB conducts. Thus the transistor QA is protected by the action of phase B. Likewise, phase A will protect the transistor QB when QB is switched from an on state to an off state. The result is that the invertor design inherently suppresses the commutation energy without exposing the transistor to this energy. The explanation above is based on the ideal circuit model of FIG. 6. In actuality, there is a leakage inductance in each phase as shown in FIG. 7. This leakage inductance is due to less then perfect mutual inductance between phases A and B. The leakage inductance caused by flux that couples one phase but escapes the other may nominally be 15% of the self inductance of each phase.

The leakage inductance results in two problems. First, the voltage generated by a collapsing magnetic field created by a reduction of current in phase A is not completely mirrored in phase B inasmuch as the leakage flux does not couple phase B. Thus, the energy stored in this leakage field is not suppressed and is imposed upon the transistor QA. Second, the leakage inductance in phase B generates an additional voltage drop due to the rising current in phase B. Thus, the mirrored voltage must be higher to overcome this additional voltage drop. The result is that the voltage rating of the transistors must be increased to keep them operating in their safe operating area.

These practical limitations reduce the current handling capability of the circuit from the ideal case. However, the commutation energy imposed upon the transistor has been reduced to 10% to 20% (proportional to the leakage flux as a percentage to the total flux generated by the phase) of the level imposed on the transistor in a three phase half wave design. Thus, the current capability of a three phase half wave circuit without commutating energy suppression can be five to ten times greater by switching to a four phase design.

Figure 9:
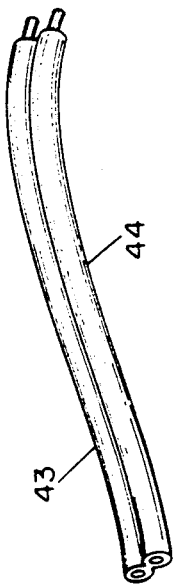
FIG. 9 is an enlarged perspective view of a bonded wire pair suitable for winding bifilar phases of the motor of FIGS. 5 to 8.

To reduce the negative effect of the leakage inductance field two practical solutions have been developed. The first solution is to use bonded bifilar wire for the bifilar phases. This differs from separate, unbonded bifilar wound phases in that two wires 43 and 44 are actually bonded together as illustrated in FIG. 9 to fix the wires a finite distance apart. This increases the coupling of the bifilar phases and thus minimizes the leakage inductance, reduces the energy in leakage field, and imposes less energy on the transistor. A bonded wire pair suitable for this purpose is MULTIFILAR ® parallel bonded magnetic wire, available from MWS Industries, 31200 Cedar Valley Drive, Westlake Village, Calif.

The second solution to the leakage inductance field, is to add a decoupling capacitance across the winding pairs of a bifilar winding. This solution is incorporated in the ECDC motor shown in FIG. 8 by means of the capacitors C2 and C6. As applied to FIG. 8, the decoupling capacitors C2 and C6 effectively act to absorb energy stored in the leakage field of the windings 35, 36, 38, and 39, so that it is not imposed on the transistors Q4, Q5, Q6 and Q7. This energy may be returned to the power source or shunted to ground when the transistors are turned back on. Also, by placing the capacitance from phase to phase instead of phase to ground, a lower capacitance or a lower rated transistor may be used. The incorporation of this capacitance is a low cost solution when incorporated into actual designs.

The two solutions for relieving the transistors 35, 36, 38 and 39 of leakage inductance field energy differ in the following manner. The capacitors C2 and C6 act to absorb the energy stored in the leakage inductance field. It involves adding components to the circuit. The bonded bifilar wire is used to reduce leakage field and minimize the energy imposed upon the transistor. It simply uses a different type of wire to produce the stator.

While one preferred embodiment of the present invention has been shown in the drawings and described in detail herein, various further modifications may be made without departing from the spirit and scope of the invention.

What is claimed is:

1. An electronically commutated dc motor comprising:
    a stator with a plurality of windings;
    a permanently magnetized rotor cooperating with said stator;
    a plurality of switching transistors, each of which is connected to conduct current to one of said windings in response to a control signal;
    a switching control means responsive to a plurality of positions of said rotor for outputting said control signals;
    a dc power input means for supplying power potential necessary to conduct current across said windings; and
    an over-voltage sensing and control circuit, including means responsive to over-voltage from said dc power input means for providing an output effective to cause conduction of each of the plurality of switching transistors simultaneously,
    whereby simultaneous conduction of the switching transistors protects the switching transistors from overvoltage condition by imposing a majority of the voltage across said stator windings.

2. An electronically commutated dc motor as recited in claim 1, wherein the means responsive to over-voltage provides the output thereof to the switching control means to cause the switching control means to effect conduction by each of the plurality of switching transistors.

3. An electronically commutated dc motor as recited in claim 2, wherein the switching control means is at least one Hall switch responsive to the position of the rotor for energizing the windings sequentially to rotate the rotor relative to the stator, and also responsive to a low voltage output by the means responsive to over-voltage for causing simultaneous conduction of each of the plurality of switching transistors.

4. An electronically commutated dc motor as recited in claim 3, wherein the switching control means comprises one Hall switch coupled to each switching transistor.

5. An electronically commutated dc motor as recited in claim 1, wherein the motor has at least two winding phases consisting of closely bonded together bifilar wires connected in reverse relation to each other, whereby each of the bonded bifilar wires provides one phase which is 180 electrical degrees out of phase with a phase provided by the remaining bifilar wire to which it is bonded.

6. An electronically commutated dc motor as recited in claim 1, further comprising a phase decoupling capacitance connecting two windings, effective after the winding has been deenergized, to absorb energy stored in a leakage inductance field of the winding, whereby the phase decoupling capacitance prevents the absorbed energy from being applied to the switching transistor corresponding to the deenergized winding.

7. An over-voltage sensing and control circuit for an electronically commutated dc motor including a stator with at least one winding, a permanently magnetized rotor cooperating with the stator, a dc power input means for supplying power necessary to energize said windings, a plurality of switching transistors, each of which is connected to conduct current to one of the stator windings in response to a control signal, and a switching control means responsive to the position of the rotor for generation of said control signals to rotate said rotor relative to the stator, comprising:

an over-voltage sensing means responsive to over-voltage from said dc power input means and which produces an output current when an over-voltage condition exists;

an over-voltage switching means responsive to said output of over-voltage sensing means for deactivating said switching control means when an over-voltage condition exists at the dc power input means; and a forward biasing means for the switching transistors causing simultaneous conduction of each of the stator windings when the switching means is deactivated, whereby simultaneous conduction of the switching transistors protects the switching transistors from overvoltage condition by imposing a majority of the voltage across said stator windings.

8. An over-voltage sensing and control circuit for an electronically commutated dc motor as recited in claim 7, in which the over-voltage sensing means comprises a zener diode connected to the dc power input means such that current passes to the over-voltage switching means only when the dc power input means voltage exceeds the reverse breakdown voltage of the zener diode.

9. An over-voltage sensing and control circuit for an electronically commutated dc motor as recited in claim 7, in which the switching control means is a Hall switch.

10. In an electronic commutator for a dc motor having a stator with a plurality of windings, a permanently magnetized rotor cooperating with said stator, a dc power input means for supplying power to said windings, and a switching control means for sequentially energizing the windings to rotate the rotor relative to the stator by generating control signals for a plurality of switching transistors coupled to the stator windings, an improvement for reducing energy imposed on the switching transistors when the windings are deenergized, comprising closely bonded together bifilar wires for the stator winding connected in a reverse relation to each other, each of the bonded bifilar wires providing one phase which is 180 electrical degrees out of phase with a phase provided by the remaining bifilar wire to which it is bonded, whereby the energy imposed on the switching transistors from a collapse of a magnetic field associated with a leakage inductance of the winding after the switching transistors are switched off is significantly reduced.

11. An electronic commutator for a dc motor as described in claim 10, further comprising a phase decoupling capacitor connecting two bonded bifilar wires, effective after the bifilar winding phase has been deenergized, to absorb energy stored in a leakage inductance field of the bifilar winding, whereby the phase decoupling capacitance prevents the absorbed energy from being applied to the switching transistor corresponding to the deenergized bifilar winding.

12. An electrically commutated dc motor and energy absorbing protection circuit for a switching transistor in a drive circuit for the electronically commutated dc motor comprising:

a stator having at least one stator winding with an even number of phases;

a permanently magnetized rotor having at least two magnetized poles;

a dc power input means to energize the winding phase;

a phase switching means to detect the relative position of the magnetized poles of the rotor and to sequentially energize the winding phases by turning on a corresponding switching transistor so as to rotate the rotor relative to the stator; and a phase decoupling capacitor interconnecting two winding phases, whereby said phase decoupling capacitor is effective after the winding has been deenergized to absorb energy stored in a magnetic field associated with a leakage inductance of the winding phase after the winding phase has been deenergized.

13. An electrically commutated dc motor comprising:

a permanently magnetized rotor having alternatingly opposite magnetic poles, cooperating with a stator;

a plurality of bifilar stator windings, each bifilar winding having a pair of bifilar strands which are 180 electrical degrees out of phase and each bifilar strand having a first lead connected to a dc power input means and a second lead connected to a corresponding switching transistor;

a switching control means coupled to the switching transistors, said switching control means controlling the conducting of current through the switching transistors so as to alternately excite the bifilar stator windings such that the rotor will rotate relative to the stator;

a linear regulating means coupled to the dc power input means, said linear regulating means operative for forward biasing each of the switching transistors such that the switching transistor conducts current through said windings unless otherwise switched by said switching control means;

a phase decoupling capacitance connecting the winding pairs of the bifilar winding, said phase decoupling capacitance effective after the winding has been deenergized to absorb energy stored in the leakage inductance field of the winding phase, such that energy produced by the leakage inductance field is not imposed on the corresponding switching transistor;

an over-voltage sensing and control circuit having a first input connected to the dc power supply input means, a sensing means for detecting if the input voltage has exceeded a predetermined amplitude, and a control means for supplying power to the switching control means when the amplitude is below the predetermined amplitude and for deactivating the switching control means when the dc power input means exceeds the maximum allowed amplitude;

whereby, deactivating the switching control means causes simultaneous conduction of the switching transistors protecting said switching transistors from over-voltage by imposing a majority of the voltage across the bifilar stator windings.

14. A method for protecting against power surges in a electrically commutated dc motor having a stator with a plurality of windings, each winding having a switching transistor for controlling current flow therethrough, a permanently magnetized rotor cooperative with said stator, a dc power input means for supplying power potential necessary to conduct current across said windings a switching control circuit for controlling the sequential operating function of said switching transistors, and an over-voltage sensing and control circuit responsive to said dc input means for generating a deactivation signal for causing conduction of the plurality of switching transistors simultaneously, comprising the steps of:

impressing a potential across said over-voltage sensing and control means representative of the dc power input means;

detecting when an over-voltage condition occurs in the over-voltage sensing and control circuit; and causing simultaneous conduction of all the switching transistors until the over-voltage condition ends, whereby simultaneous conduction of the switching transistors protects the switching transistors from over-voltage by imposing a majority of the voltage across the stator windings.

* * * * *